(12) United States Patent  
Schwent et al.

(10) Patent No.: US 7,580,723 B2
(45) Date of Patent: Aug. 25, 2009

(54) METHOD AND APPARATUS FOR DUAL MODE POWER CONTROL

(75) Inventors: Dale G. Schwent, Schaumburg, IL (US); Mark A. Kirschenmann, Chandler, AZ (US); Robert S. Trocke, Caledonia, WI (US)

(73) Assignee: Motorola, Inc., Schaumburg, IL (US)

( * ) Notice: Subject to any disclaimer, the term of this patent is extended or adjusted under 35 U.S.C. 154(b) by 516 days.

(21) Appl. No.: 10/929,614

(22) Filed: Aug. 30, 2004

(65) Prior Publication Data

US 2006/0046763 A1    Mar. 2, 2006

(51) Int. Cl.
*H04B 7/00* (2006.01)
(52) U.S. Cl. ...................................... 455/522
(58) Field of Classification Search ................... 455/522
See application file for complete search history.

(56) References Cited

U.S. PATENT DOCUMENTS

| | | | |
|---|---|---|---|
| 5,438,683 A * | 8/1995 | Durtler et al. ................. | 455/74 |
| 6,304,749 B1 | 10/2001 | Obara | |
| 6,606,483 B1 * | 8/2003 | Baker et al. ................. | 455/126 |
| 6,985,751 B2 * | 1/2006 | Bartl et al. ................... | 455/522 |
| 7,069,035 B2 * | 6/2006 | Chen et al. ................... | 455/522 |
| 7,095,801 B1 * | 8/2006 | Magoon et al. ............. | 375/302 |
| 2002/0132595 A1 * | 9/2002 | Kokubo ....................... | 455/119 |

FOREIGN PATENT DOCUMENTS

EP    1343254    9/2003

* cited by examiner

*Primary Examiner*—Matthew D Anderson
*Assistant Examiner*—Bobbak Safaipour
(74) *Attorney, Agent, or Firm*—Gary J. Cunningham (57) ABSTRACT

An apparatus and method for dual mode power control. A transmitter is capable of operating in a first mode of operation and a second mode of operation, the first mode of operation and the second mode of operation including a closed loop control mode and an open loop control mode, the first mode of operation being different from the second mode of operation. The transmitter can be operated in the first mode of operation. A transmitter output power characteristic of the first mode of operation can be read back. The transmitter output power characteristic of the first mode of operation can be correlated to a transmitter output power characteristic of the second mode of operation. The first mode of operation can be switched to the second mode of operation based on the transmitter output power characteristic of the second mode of operation.

16 Claims, 6 Drawing Sheets

METHOD AND APPARATUS FOR DUAL MODE POWER CONTROL

BACKGROUND

1. Field

The present disclosure is directed to a method and apparatus for dual mode power control. More particularly, the present disclosure is directed to switching between an open loop power control mode and a closed loop power control mode.

2. Description of Related Art

Presently, in Code Division Multiple Access (CDMA) systems, transmitter output power must be controlled very precisely over a wide dynamic range. Radio open loop control systems can be used to cover the wide dynamic range. Unfortunately, it is difficult to precisely control radio open loop control systems. Furthermore radio open loop control system control requires extensive pre-characterization and real time monitoring of temperature, voltage, radio frequency, and the like in order to maintain precise control of the radio power output. Radio open loop control systems are also less tolerant of power amplifier efficiency enhancement techniques, such as load switching, bias switching, and stage bypassing, because these techniques all tend to introduce power amplifier gain variations that are difficult to predict and characterize.

Precision control can be easier to maintain in a radio closed loop system. Unfortunately, radio closed loop systems do not have a wide enough dynamic range to cover CDMA operating requirements. The primary limitation of a radio closed loop system being the dynamic range of the radio frequency power detection element, which incurs significant costs and current drains when attempting to meet the CDMA dynamic range requirements.

Thus, there is a need for a radio power control system that is both precise and covers a wide dynamic range in a cost and current drain efficient manner. There is also a need for a radio power control system that can make power amplifier efficiency enhancement techniques more realizable and that can reduce the characterization and monitoring requirements of a strictly open loop control system. These and other benefits can be achieved by the teachings of the present disclosure.

SUMMARY

The disclosure provides an apparatus and method for dual mode power control. A transmitter is capable of operating in a first mode of operation and a second mode of operation, the first mode of operation and the second mode of operation including a closed loop control mode and an open loop control mode, the first mode of operation being different from the second mode of operation. The transmitter can be operated in the first mode of operation. A transmitter output power characteristic of the first mode of operation can be read back. The transmitter output power characteristic of the first mode of operation can be correlated to a transmitter output power characteristic of the second mode of operation. The first mode of operation can be switched to the second mode of operation based on the transmitter output power characteristic of the second mode of operation.

BRIEF DESCRIPTION OF THE DRAWINGS

The embodiments of the present invention will be described with reference to the following figures, wherein like numerals designate like elements, and wherein.

DETAILED DESCRIPTION

Figure 1:
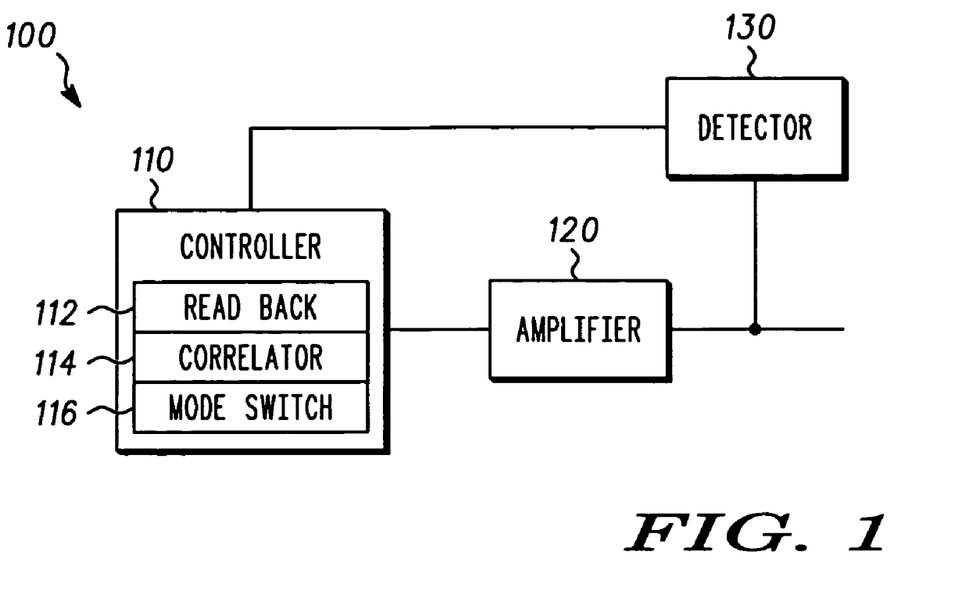
FIG. 1 is an exemplary block diagram of a transmitter according to one embodiment.

FIG. 1 is an exemplary block diagram of a transmitter 100 according to one embodiment. The transmitter 100 can include a controller 110, an amplifier 120, and a detector 130. The controller 110 can include a read back module 112, a correlator module 114, and a mode switch module 116. The detector 130 can measure a transmitter output power. The transmitter 100 can operate in a first mode of operation and a second mode of operation, the first mode of operation and the second mode of operation including a closed loop control mode and an open loop control mode, the first mode of operation being different from the second mode of operation. The controller 110 can initially operate the transmitter 100 in the first mode of operation. The read back module 112 can be configured to read back a transmitter output power characteristic of the first mode of operation. The correlator module 114 can be configured to correlate the transmitter output power characteristic of the first mode of operation to a transmitter output power characteristic of the second mode of operation. The mode switch module 116 can be configured to switch from the first mode of operation to the second mode of operation according to the transmitter output power characteristic of the second mode of operation. The transmitter output power characteristic can be a measured output power characteristic, an output power control line characteristic, or any other transmitter output power characteristic. The mode switch module 116 can be further configured to switch from the first mode of operation to the second mode of operation on a rising edge of a power control slot timing signal. The closed loop control mode can use feedback of an output power measurement of the transmitter 100 detected by the detector 130 to control the output power of the transmitter 100. The open loop control mode can use pre-characterization of the transmitter 100 to control the output power of the transmitter 100. For example, the pre-characterization can include values characterizing the operation of the amplifier 120 with respect to various operating conditions with the values stored in tables in the controller 110.

The controller 110 can receive a power control command from a base station or the like to change the output power of the transmitter 100 from a first output power to a second output power. For example, the first mode of operation can be an open loop control mode of operation and the second mode of operation can be a closed loop control mode of operation. Accordingly, the read back module 112 can read back a transmitter output power characteristic by reading back the transmitter output power measured by the detector 130. The correlator module 114 can then correlate the transmitter output power of the open loop control mode of operation to a closed loop control line value for the second output power characteristic of the closed loop control mode of operation. The closed loop control line value can be used to control the output power of the amplifier 120. For example, a closed loop control line value can be a power target input, and accumulator output, or any other control line value. Prior to switching from the first mode of operation to the second mode of operation, the controller 110 can compare the second output power to a threshold and the mode switch module 116 can switch from the first mode of operation to the second mode of operation if the second output power is greater than or equal to the threshold.

According to another example, the first mode of operation can be a closed loop control mode of operation and the second mode of operation can be an open loop control mode of operation. Accordingly, the read back module 112 can read back a transmitter output power characteristic by determining a closed loop control line value. The correlator module 114 can then correlate the closed loop control line value for the first output power of the closed loop control mode of operation to an open loop control line value for the second output power of the open loop control mode of operation. The open loop control line value can be used to control the output power of the amplifier 120. Prior to switching from the first mode of operation to the second mode of operation, the controller 110 can compare the second output power to a threshold and the mode switch module 116 can switch from the first mode of operation to the second mode of operation if the second output power is less than the threshold.

Combining open loop and closed loop techniques into this disclosed architecture can reduce factory calibration requirements in the higher power region of operation, as compared to existing open loop implementations. It can also enable power amplifier efficiency enhancement techniques that can otherwise be very difficult to implement in an open loop only system. These power amplifier techniques otherwise often have difficulty predicting effects on power amplifier gain and require extensive open loop calibration and monitoring when added to traditional, open loop only, power control systems.

Additionally, the closed/open loop transition features described herein can provide additional benefits. For example, according to this disclosure, the first state of a transmitter system after a transition can always be synchronized to the last state of the system prior to a transition, which guarantees a smooth transition between states. The power target for an upcoming slot after a transition can be always calculated from known previous information. If the transmitter 100 is transitioning from closed to open loop, the previous control line state can be used to calculate the next open loop control line value. If the transmitter 100 transitions from open to closed loop, the previous average radio frequency detected power, which would match a closed loop target if the loop were closed and locked, can be used to calculate the next closed loop power.

Figure 2:
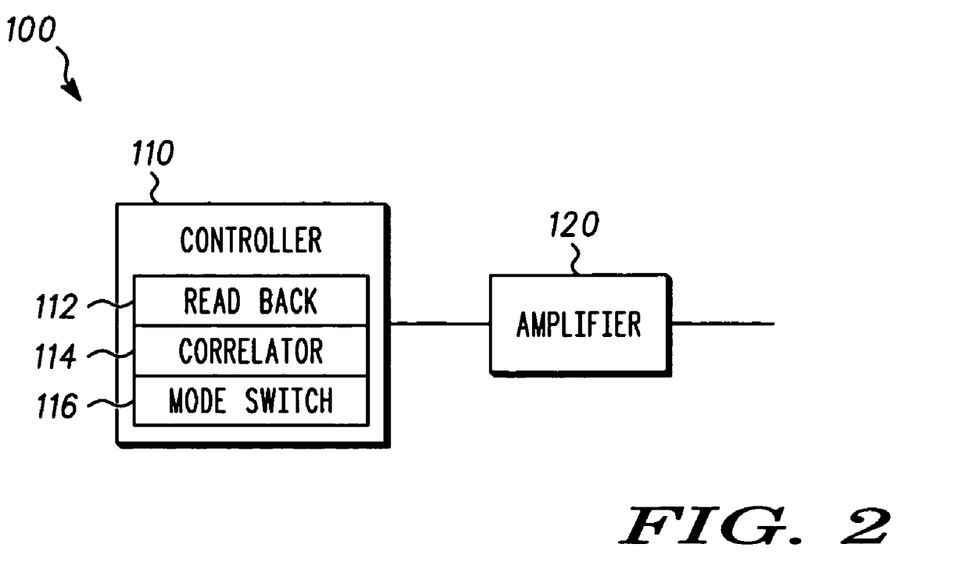
FIG. 2 is an exemplary block diagram of the transmitter in an open loop mode of operation according to one embodiment.

FIG. 2 is an exemplary block diagram of the transmitter 100 in an open loop mode of operation. In particular, in the open loop mode of operation the transmitter 100 does not necessarily use the detector 130 at the output of the amplifier 120. While the detector 130 is not necessarily physically removed during the open loop mode of operation, it is also not necessary for the controller 110 to use the output of the detector 130 to control the power of the amplifier 120 during the open loop mode of operation.

The transmitter 100 may be used in a code division multiple access (CDMA) communication system, in a time division multiple access (TDMA) communication system, in a wideband CDMA (WCDMA) communication system, or in any other communication system. Also, techniques disclosed herein may be used for any power amplifier where it can be useful to transition between open loop and closed loop control modes.

Figure 3:
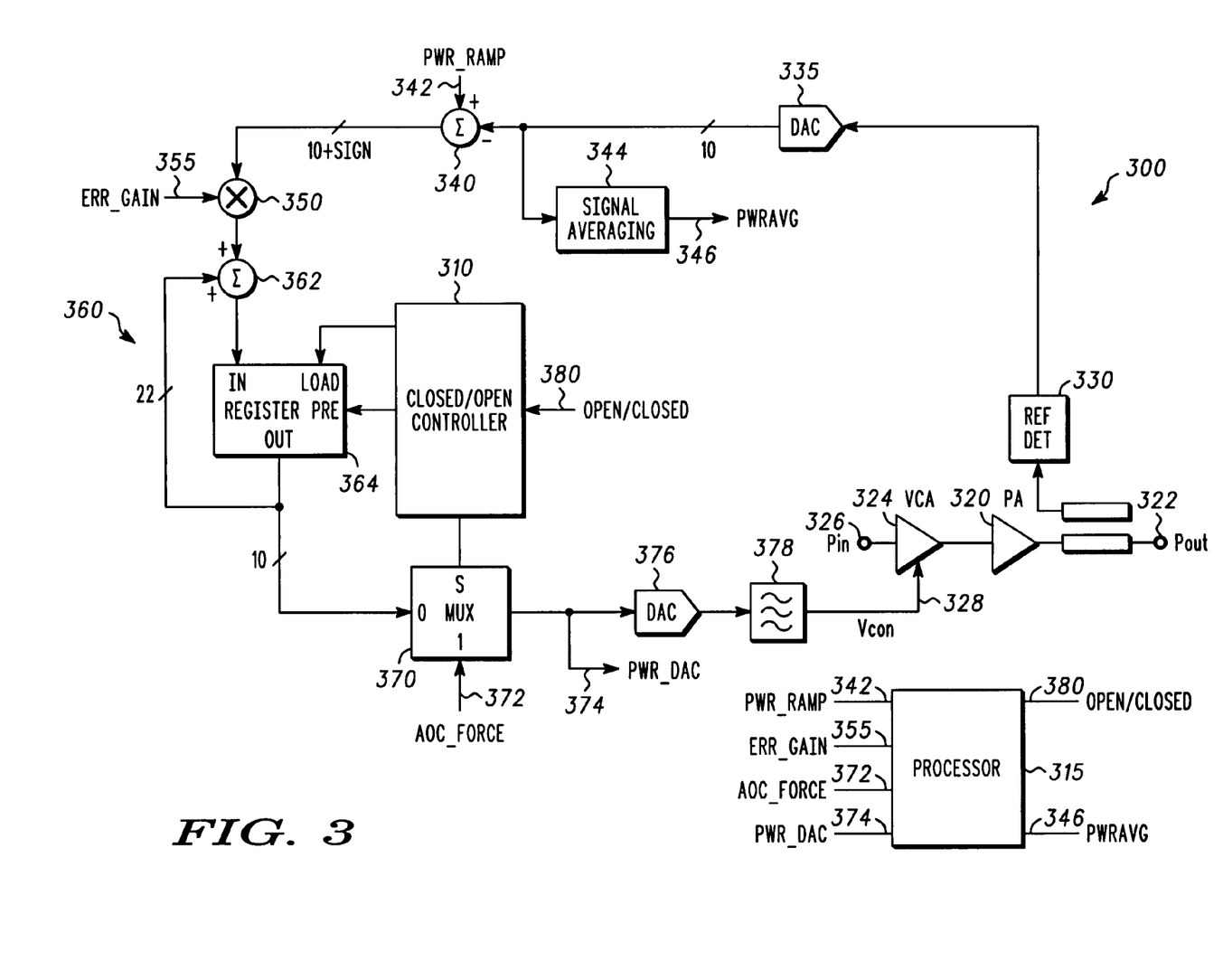
FIG. 3 is an exemplary block diagram of a transmitter according to another related embodiment.

FIG. 3 is an exemplary block diagram of a transmitter 300 according to another related embodiment. The transmitter 300 can operate using automatic output control. Various features of the transmitter 300 can be used in the transmitter 100. However, the features of the transmitter 300 are not essential to the operation of the transmitter 100.

The transmitter 300 can include a closed/open loop controller 310, a processor 315, a power amplifier (PA) 320 including an output 322, a voltage controlled attenuator (VCA) 324 having a radio frequency (RF) input 326 and a control voltage input 328, a RF detector 330, an analog-to-digital (A/D) converter 335, an error summer 340 having a power target input PWR_Ramp 342, a signal averaging module 344 having a power average output PWRAVG 346, a multiplier 350 having an error gain input ERRGain 355, an accumulator 360, a multiplexer 370 including a power control line input AOC_FORCE 372 and an output 374 representing the digital words PWRDAC applied to a power control digital-to-analog (D/A) converter 376, and a filter 378. The accumulator 360 can include a summer 362 and a register 364.

In operation, the processor 315 can control operations of the transmitter 300 along with other operations of a device in which the transmitter 300 is located. For example, the processor 315 can send an open/closed signal 380 to control the mode of operation of the closed/open controller 310. Alternately, either the closed/open controller 310 or the processor 315 may control all or different parts of the operations of the transmitter 300. Modulated RF input power at a nominal level can be developed and applied to the input 326 of the VCA 324. The VCA 324 can act as a power adjusting element in the system, with the power out of the VCA 324 dependent on the applied control voltage Vcon 328. This variable output power can be further amplified in the PA 320 to achieve the desired output power levels of the radio transmitter 300. A small portion of the PA power out 322 is coupled off from the main RF signal and applied to the RF detector 330. This detector 330 generates a voltage proportional to the RF signal applied to it, and therefore, proportional to the power out 322 of the PA 320. The detected power is sampled by the A/D converter 335 which converts the detected voltages into digital words.

In the closed loop portion of the hybrid power control system these RF detect digital words are applied to an error summer 340 that compares the detected digital words to a power target represented by the PWR_Ramp 342. The difference between the detected words and the PWR_Ramp 342 target represents the error signal in the system. In the case of CDMA modulations, the detected words can constantly change with the RF power variations of the modulation. Since the PWR_Ramp 342 can be a constant value representing the desired average power, the error signal can have relatively large variations. The control loop can be considered to have reached its target if the average value of the error signal is zero.

A digital multiplier 350 can compute the product of the error signal and a programmable value ERRGain 355. This ERRGain value 355 can always be less than 1.0 and can be used to control the speed and stability of the closed loop. As the value of ERRGain 355 becomes larger, the loop speed can increase, its stability margins can decrease, and the variations in the error signal can be transferred more effectively through the loop. A useful requirement on ERRGain 355 can be that it can be small enough to allow the loop to act as a filter to the error signal variations. This can allow the output of the loop to be relatively constant, reducing undesirable degradations to the RF modulated signal. The output of the ERRGain multiplier 350 can be applied to the digital accumulator 360, shown as the summer 362 and the register 364. This accumulator 360 can provide the required integration of the error voltage needed to achieve closed loop control. The output of the register 364 can drive a multiplexer 370, which in closed loop mode is connected to the system D/A converter 376. This D/A converter 376 can change the digital control words back to an analog voltage, which can be filtered by the filter 378 and applied to the VCA 324, thus controlling its gain and therefore the output power of the loop.

In open loop mode digital words can be applied directly at AOC_FORCE 372 and the multiplexer 370 can be switched to apply these words to the D/A converter 376 to provide power control. Many of the previous elements described, from the RF detector 330 through to the accumulator 360, are not needed in the open loop mode and may not be used.

As an example, over the top 20 to 30 dB of the required dynamic range, the multiplexer 370 can be switched to apply the accumulator 360 register's 364 output to the D/A converter 376 input, allowing closed loop control. At lower RF power levels, the multiplexer 370 can be switched to provide AOC_FORCE words 372 to the D/A converter 376 input, allowing open loop control.

There can be additional features to handle the transition of the transmitter 300 between open loop and closed loop modes. For example, the PWRDAC value 374 can be a system output to an external microprocessor based controller 315. PWRDAC 374 can represent the digital words being applied to the power control D/A converter 376. In open loop mode, the PWRDAC 374 can be equal to AOC_FORCE 372. Also, a digital signal averaging block 344 connected to the output of the A/D converter 335 can report an average power to the microprocessor 315 called PWRAVG 346. In closed loop mode, when the power control loop has reached steady state, PWRAVG 346 can be equal to PWR_Ramp 342. Additionally, the closed/open controller 310 can manage switching of the multiplexer 370 between closed and open loop states and can load the accumulator 360 with an appropriate transition value. This closed/open controller 310 can be managed by the microprocessor 315 in terms of determining the time of a closed/open loop transition, but the closed/open controller 310 itself can manage internal timing and synchronization of the multiplexer 370 switching and the accumulator 360 loading.

Figure 4:
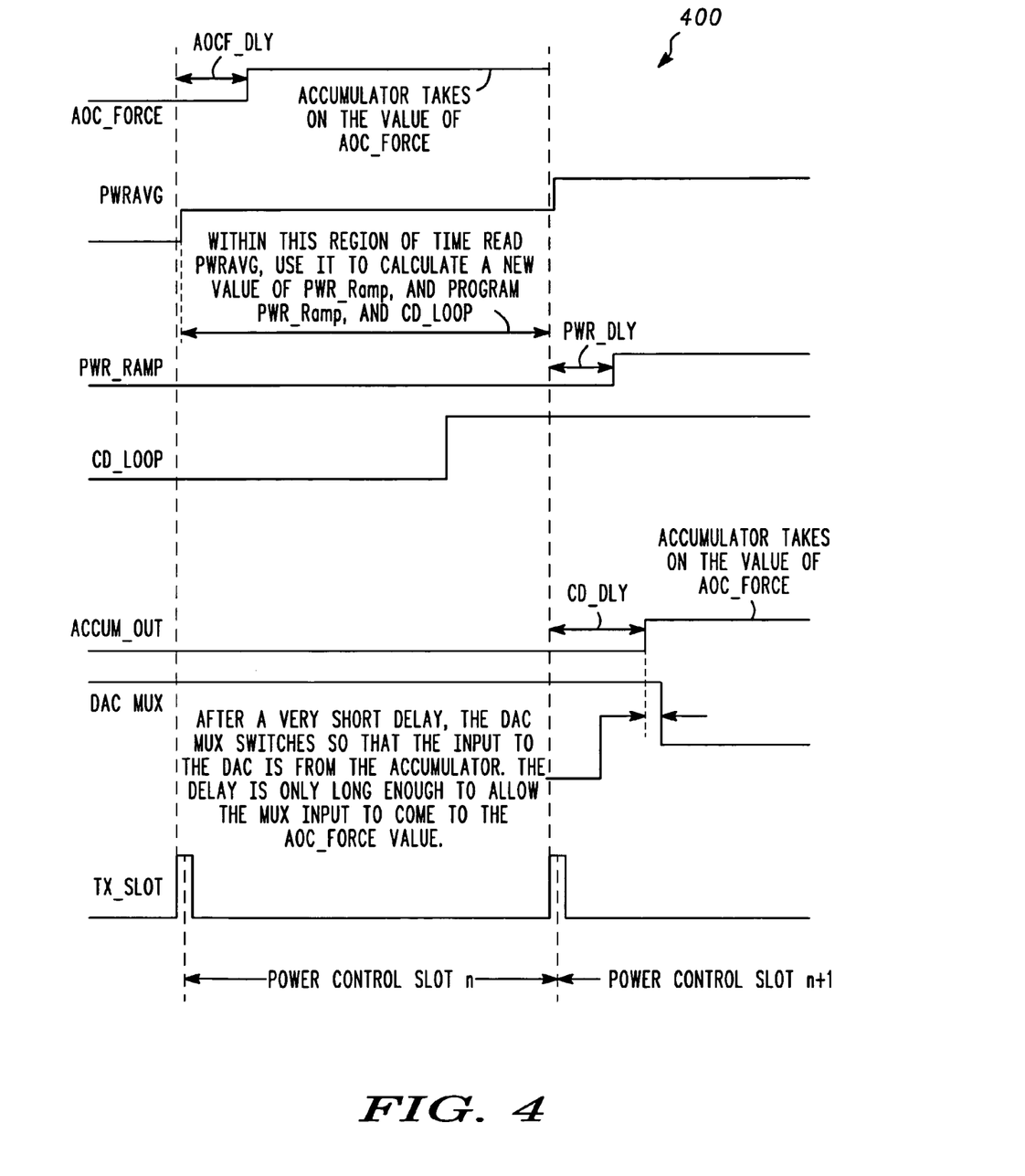
FIG. 4 is an exemplary timing diagram illustrating signaling of the transmitter for transitioning from open loop to closed loop operation according to one embodiment.

FIG. 4 is an exemplary timing diagram 400 illustrating signaling of the transmitter 300 for transitioning from open loop to closed loop operation according to one embodiment. This transition uses a processor 315 controlled signal CD_LOOP. The TX_SLOT signal can be a timing signal generated in the processor 315. TX_SLOT can be synchronized to the slot boundaries of a CDMA or WCDMA system, which are the times at which power changes are scheduled to occur. Power can be initially controlled by changes in AOC_FORCE 372 which can take effect at the end of the AOCF_DLY interval shown. Software in the processor 315 can also monitor the readback values from PWRAVG 376. Since the signal averaging circuit 344 can average power outside the power transition regions, and can average power on a slot by slot basis, it can accurately report the power level of any previous slot. As the power increases, at some point the PWRAVG value 346 can exceed a threshold that has been set as the desired value to transition to closed loop operation. The actual change to closed loop operation can be controlled by the CD_LOOP signal. When CD_LOOP goes high, the transmitter 300 can transition to closed loop automatic output control on the next power control slot. The processor 315 can use the value it read from PWRAVG 346 as the value of the previous slot's power. This value, along with the desired power change for the upcoming slot can be used to compute PWR_Ramp to be sent to the the closed/open controller 310. PWR_Ramp can represent the target power for the upcoming slot. PWR_Ramp and CD_LOOP can be programmed prior to TX_SLOT, to take effect in the next power control slot.

In automatic output control hardware the transition to closed loop can occur automatically relative to the rising edge of TX_SLOT. The interval denoted CD_DLY can define the time from the rising edge of TX_SLOT, to the time the digital accumulator 360 is loaded with the current value of AOC_FORCE 372, and can be controlled through the processor 315. The digital accumulator 360 can then be forced to the most recent AOC_FORCE value 372. Also, the multiplexer 370 can be switched from AOC_FORCE 372 to the accumulator 360 output. This can occur slightly delayed in time from the accumulator 360 load to avoid a glitch on the output 322. The delay can be long enough to allow the accumulator 360 value to propagate to the input of the multiplexer 370. A longer delay can allow the accumulator 360 to drift off its loaded value in an open loop fashion, which can also cause a glitch.

Figure 5:
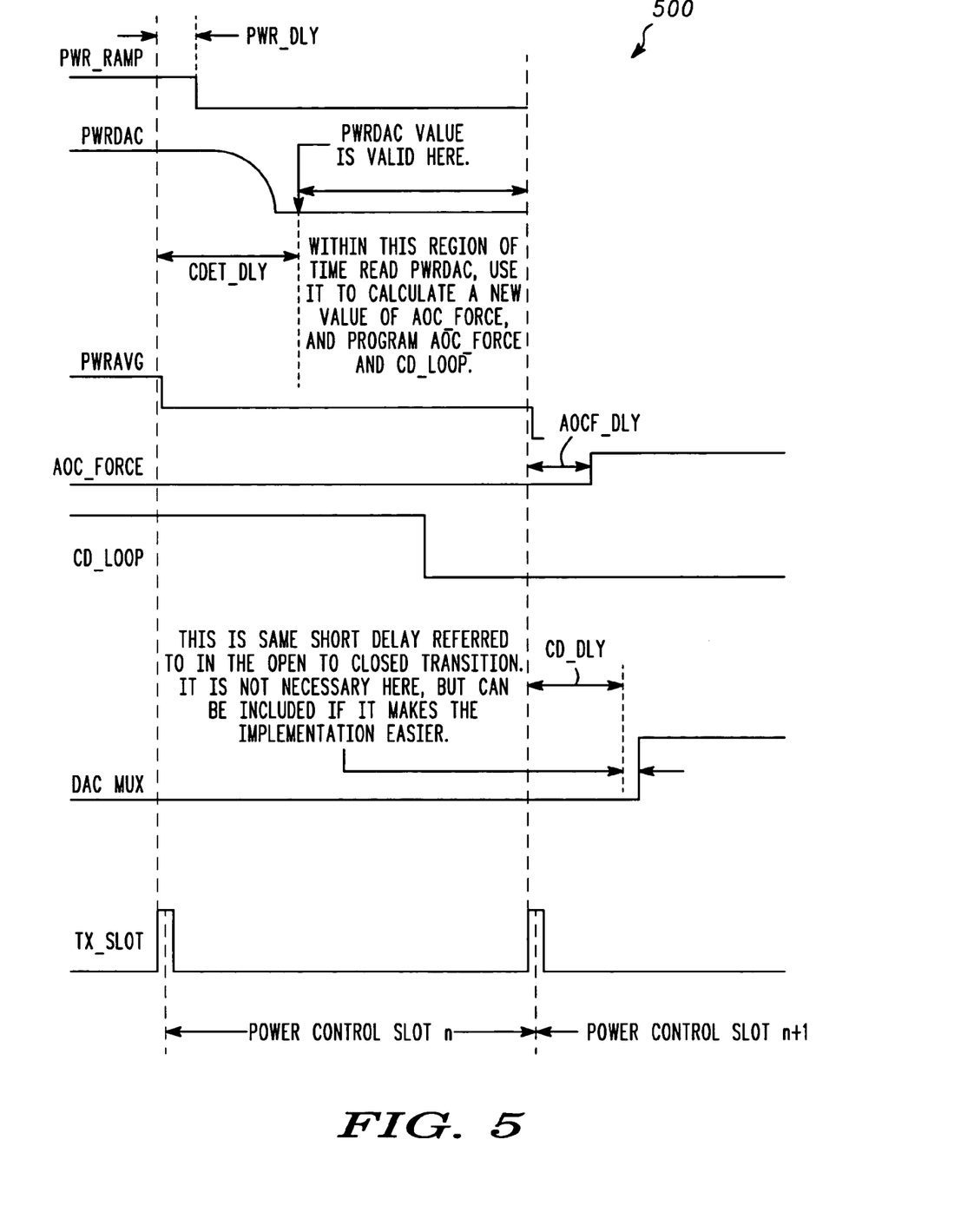
FIG. 5 is an exemplary timing diagram illustrating signaling of the transmitter for transitioning from closed loop to open loop operation according to one embodiment.

FIG. 5 is an exemplary timing diagram 500 illustrating signaling of the transmitter 300 for transitioning from closed loop to open loop operation according to one embodiment. This transition can also be initiated by CD_LOOP. Power can initially be controlled by changes in PWR_Ramp 342, which can take effect after the PWR_DLY interval shown. The processor 315 can also monitor the readback values from PWRAVG 346 and PWRDAC 374. In the case of PWRDAC 374, a programmable delay interval, CD_DLY, set up in the processor 315, can prevent this reading from occurring too soon after the start of a power control slot, to allow all transients to die out. When the CD_DLY interval ends, the output of the multiplexer 370 can be read. PWRAVG 346 may be read at any time within the current slot, outside the power transition regions, to get indication of the power detected in the last slot.

As the power decreases, at some point the PWRAVG value 346 can drop below a threshold that has been set as the desired value to transition to open loop operation. The actual change to open loop operation can be controlled by the signal CD_LOOP. When CD_LOOP goes low, the transmitter 300 can transition to open loop automatic output control on the next power control slot. The processor 315 can use the value it read from PWRDAC 374 as the value of the previous slot's control line. This value, along with the desired power change for the upcoming slot can be used to compute AOC_FORCE 372 to be sent to the multiplexer 370. AOC_FORCE 372 can represent the target control line for the upcoming slot. AOC_FORCE 372 and CD_LOOP can be programmed prior to TX_SLOT, to take effect in the next power control slot.

In the transmitter 300, the transition to open loop can occur automatically relative to the rising edge of TX_SLOT. The interval denoted CD_DLY can define the time from the rising edge of TX_SLOT, to the time multiplexer 370 is loaded with the current value of AOC_FORCE, and can be controlled through the processor 315. The automatic transition can be a simple change of state of the multiplexer 370 in front of the D/A converter 376 to deliver AOC_FORCE values directly to the D/A converter 376.

Figure 6:
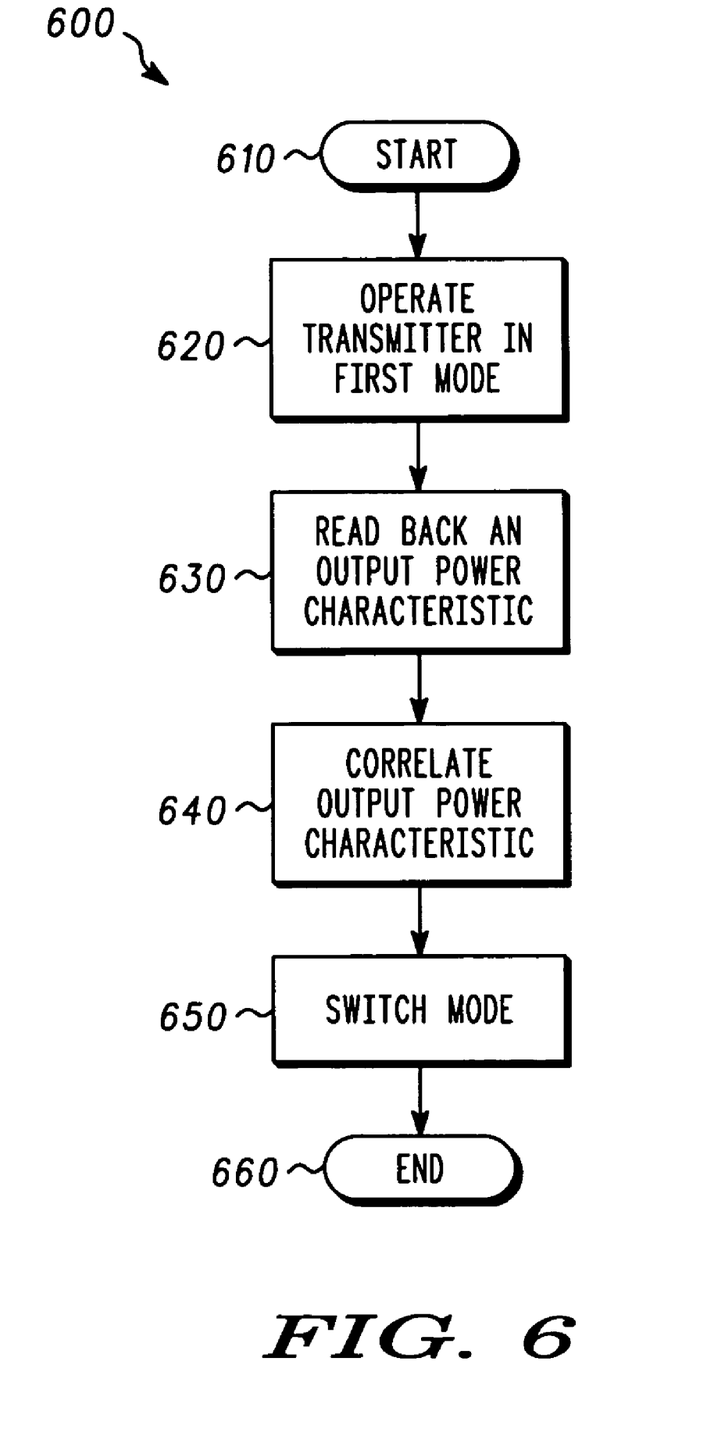
FIG. 6 is an exemplary flowchart outlining the operation of a transmitter according to one embodiment.

FIG. 6 is an exemplary flowchart 600 outlining the operation of the transmitter 100 or the transmitter 300 according to one embodiment. For example, flowchart 600 illustrates the operation of a device, such as a wireless device, including a transmitter. The transmitter 100 can operate in a first mode of operation and a second mode of operation. For example, the first mode of operation and the second mode of operation can include a closed loop control mode and an open loop control mode, the first mode of operation being different from the second mode of operation. In step 610, the flowchart begins. In step 620, the transmitter 100 operates in the first mode of operation. In step 630, the transmitter 100 reads back a transmitter output power characteristic of the first mode of operation. In step 640, the transmitter 100 correlates the transmitter output power characteristic of the first mode of operation to a transmitter output power characteristic of the second mode of operation. In this step, the transmitter 100 can also determine an actual desired output power of the second mode of operation based on the transmitter output power characteristic of the second mode of operation. In step 650, the transmitter 100 switches from the first mode of operation to the second mode of operation based on the transmitter output power characteristic of the second mode of operation.

The transmitter output power characteristic can be a measured output power characteristic, for example, measured by the detector 130, an output power control line characteristic, such as an open loop control line value, or the like. Switching can be performed on a rising edge of a power control slot timing signal, at a delayed time with respect to the power control slot timing signal, or with respect to any other useful signal used by the controller 110. The closed loop control mode can use feedback of an output power measurement of the transmitter 100, such as a detector 130 measurement, to control the output power of the transmitter. The open loop control mode can use pre-characterization of the transmitter 100, such as pre-characterization of the amplifier 120, to control the output power of the transmitter 100.

The first mode of operation can be an open loop control mode of operation and the second mode of operation can be a closed loop control mode of operation. Thus, while operating in the first mode, the transmitter 100 can receive a power control command to change the output power of the transmitter 100 from a first output power to a second output power. Then, when reading back a transmitter output power characteristic, the transmitter 100 can measure a transmitter output power, for example, by using the detector 130. The transmitter 100 can then correlate the transmitter output power of the open loop control mode of operation to a closed loop control line value for the second output power characteristic of the closed loop control mode of operation. Prior to switching, the transmitter 100 can compare the second output power to a threshold and may only perform the switching step if the second output power is greater than or equal to the threshold.

The first mode of operation can be a closed loop control mode of operation and the second mode of operation can be an open loop control mode of operation. Thus, when operating in the first mode, the transmitter 100 can receive a power control command to change the output power of the transmitter 100 from a first output power to a second output power. Then, when reading back a transmitter output power characteristic, the transmitter 100 can determine a closed loop control line value. The transmitter 100 can then correlate the closed loop control line value for the first output power of the closed loop control mode of operation to an open loop control line value for the second output power characteristic of the open loop control mode of operation. Prior to switching, the transmitter 100 can compare the second output power to a threshold and may only perform the switching step if the second output power is less than the threshold.

Figure 7:
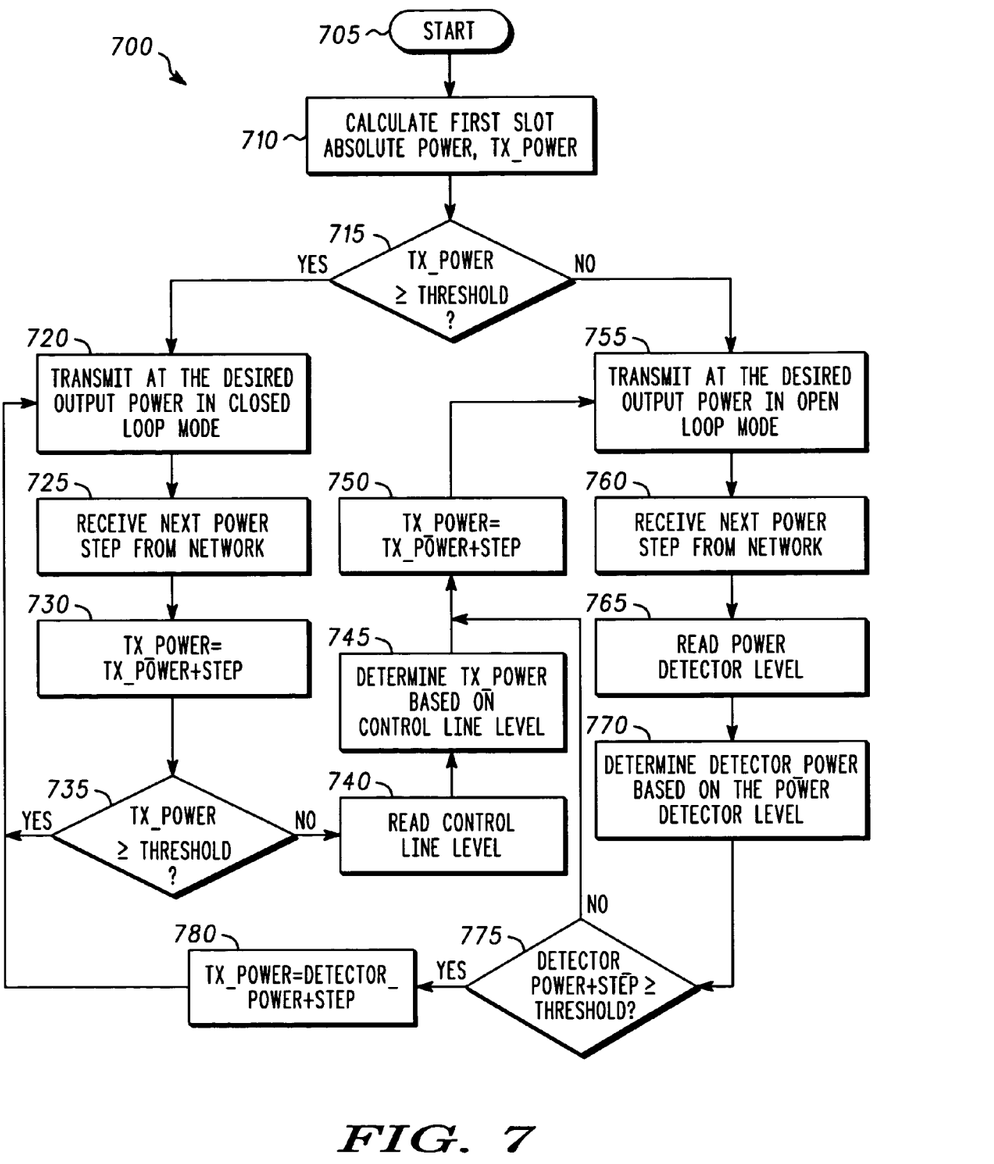
FIG. 7 is an exemplary flowchart outlining the operation of a transmitter according to another embodiment.

FIG. 7 is an exemplary flowchart 700 outlining the operation of the transmitter 100 or the transmitter 300 according to another related embodiment. Various steps of the flowchart 700 may be interchangeable with or added into the flowchart 600. In step 705, the flowchart begins. In step 710, the transmitter 300 calculates Tx_power as the first slot absolute power. For example, Tx_power can be a power reference variable related to the desired output power Pout 322 in dBm. In step 715, the transmitter 300 compares the Tx_power to a threshold. If Tx_power is greater than the threshold, in step 720, the transmitter 300 transmits at the desired output power level based on Tx_power in a closed loop mode of operation. For example, the transmitter 300 can set the desired output power based on PWR_Ramp. In step 725, the transmitter 300 can receive the next power step from a network. For example, the transmitter 300 can receive the next power step in dB. In step 730, the transmitter 300 can set the variable Tx_power to be equal to the old value of Tx_power plus the step value, which may be a positive or negative step value. In step 735, the transmitter 300 can compare Tx_power to a threshold. If Tx_power is greater or equal to the threshold, the transmitter 300 returns to step 720. If Tx_power is less than the threshold, in step 740, the transmitter 300 can read a control line value, such as PWRDAC 374. In step 745, the transmitter 300 determines Tx_power based on the control line level. In step 750, the transmitter 300 modifies Tx_power by adding the step value to Tx_power. The transmitter 300 then advances to step 755.

In step 715, if Tx_power is less than the threshold, in step 755, the transmitter 300 transmits at the desired output power level based on Tx_power in the open loop mode of operation. For example, the transmitter 300 can set the output power using AOC_FORCE. In step 760, the transmitter 300 can receive a power step from a network. In step 765, the transmitter 300 can read the power detector 330 level, such as by reading PWRAVG 346. In step 770, the transmitter 300 can determine a Detector_Power value based on the power detector level. In step 775, the transmitter 300 can determine if the Detector_Power value plus the step value is greater than or equal to a threshold. If not, the transmitter advances to step 750. If so, in step 780, the transmitter sets the Tx_power value to be the Detector_Power value plus the step power value and advances to step 720.

The method of this invention is preferably implemented on a programmed processor. However, the controllers, flowcharts, and modules may also be implemented on a general purpose or special purpose computer, a programmed microprocessor or microcontroller and peripheral integrated circuit elements, an ASIC or other integrated circuit, a hardware electronic or logic circuit such as a discrete element circuit, a programmable logic device such as a PLD, PLA, FPGA or PAL, or the like. In general, any device on which resides a finite state machine capable of implementing the flowcharts shown in the Figures may be used to implement the processor functions of this invention.

While this invention has been described with specific embodiments thereof, it is evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the invention by simply employing the elements of the independent claims. Accordingly, the preferred embodiments of the invention as set forth herein are intended to be illustrative, not limiting.

Various changes may be made without departing from the spirit and scope of the invention.

What is claimed is:

1. A method of operating a device including a transmitter, the transmitter capable of operating in a first mode of operation and a second mode of operation, the first mode of operation and the second mode of operation including a closed loop control mode and an open loop control mode, the first mode of operation being different from the second mode of operation, the method comprising:

operating the transmitter in the first mode of operation, wherein the first mode of operation comprises an open loop control mode of operation;

reading back a transmitter output power characteristic during the first mode of operation, to control the second mode of operation, wherein the second mode of operation comprises a closed loop control mode of operation, further wherein the reading back the transmitter output power characteristic comprises measuring a transmitter output power;

receiving a power control command to change the output power of the transmitter from a first output power to a second output power;

correlating the read back transmitter output power characteristic during the first mode of operation to a transmitter output power characteristic of the second mode of operation, wherein the correlating comprises correlating the transmitter output power of the open loop control mode of operation to a closed loop control line value for the second output power characteristic of the closed loop control mode of operation;

determining a desired output power of the second mode of operation based on the transmitter output power characteristic of the second mode of operation;

comparing the transmitter output power characteristic of the second mode of operation to a threshold; and switching from the first mode of operation to the second mode of operation based on the transmitter output power characteristic of the second mode of operation where the comparing the transmitter output characteristic of the second mode of operation to the threshold meets a predefined criterion.

2. The method according to claim 1, wherein the transmitter output power characteristic comprises at least one of a measured output power characteristic and an output power control line characteristic.

3. The method according to claim 1, wherein switching is performed on one of a rising edge of a power control slot timing signal or a delay with respect to the power control slot timing signal.

4. The method according to claim 1, wherein the closed loop control mode uses feedback of an output power measurement of the transmitter to control the output power of the transmitter, and wherein the open loop control mode uses pre-characterization of the transmitter to control the output power of the transmitter.

5. The method according to claim 1, further comprising: comparing the second output power to a threshold, wherein switching is performed if the second output power is greater than or equal to the threshold.

6. A method of operating a device including a transmitter, the transmitter capable of operating in a first mode of operation and a second mode of operation, the first mode of operation and the second mode of operation including a closed loop control mode and an open loop control mode, the first mode of operation being different from the second mode of operation, the method comprising:

operating the transmitter in the first mode of operation, wherein the first mode of operation comprises a closed loop control mode of operation and the second mode of operation comprises an open loop control mode of operation, reading back a transmitter output power characteristic during the first mode of operation, to control the second mode of operation, wherein reading back a transmitter output power characteristic comprises determining a closed loop control line value, receiving a power control command to change the output power of the transmitter from a first output power to a second output power, correlating the read back transmitter output power characteristic during the first mode of operation to a transmitter output power characteristic of the second mode of operation, wherein correlating comprises correlating the closed loop control line value for the first output power of the closed loop control mode of operation to an open loop control line value for the second output power of the open loop control mode of operation, determining a desired output power of the second mode of operation based on the transmitter output power characteristic of the second mode of operation;

comparing the transmitter output power characteristic of the second mode of operation to a threshold; and switching from the first mode of operation to the second mode of operation based on the transmitter output power characteristic of the second mode of operation where the comparing the transmitter output characteristic of the second mode of operation to the threshold meets a predefined criterion.

7. The method according to claim 6, further comprising:

comparing the second output power to a threshold, wherein switching is performed if the second output power is less than the threshold.

8. A transmitter configured to operate in a first mode of operation and a second mode of operation, the first mode of operation and the second mode of operation including a closed loop control mode and an open loop control mode, the first mode of operation being different from the second mode of operation, the transmitter comprising:

a power amplifier;

a controller coupled to the power amplifier, the controller configured to operate the transmitter in the first mode of operation, the controller including a read back module configured to read back a transmitter output power characteristic of the first mode of operation;

a correlator module configured to correlate the transmitter output power characteristic of the first mode of operation to a transmitter output power characteristic of the second mode of operation; and a mode switch module configured to switch from the first mode of operation to the second mode of operation according to the transmitter output power characteristic of the second mode of operation meeting a predefined criterion relative to a comparison threshold; and a detector coupled to the output of the power amplifier and the controller, the detector configured to measure a transmitter output power, wherein the controller is configured to receive a power control command to change the output power of the transmitter from a first output power to a second output power, wherein the first mode of operation comprises an open loop control mode of operation and the second mode of operation comprises a closed loop control mode of operation, wherein the read back module is further configured to read back a transmitter output power characteristic by reading back the measured transmitter output power, and wherein the correlator module is further configured to correlate the transmitter output power of the open loop control mode of operation to a closed loop control line value for the second output power characteristic of the closed loop control mode of operation.

9. The transmitter according to claim 8, wherein the transmitter output power characteristic comprises at least one of a measured output power characteristic and an output power control line characteristic.

10. The transmitter according to claim 8, wherein the mode switch module is further configured to switch from the first mode of operation to the second mode of operation on one of a rising edge of a power control slot timing signal or a delay with respect to the power control slot timing signal.

11. The transmitter according to claim 8,
wherein the closed loop control mode comprises using feedback of an output power measurement of the transmitter to control the output power of the transmitter, and wherein the open loop control mode comprises using pre-characterization of the transmitter to control the output power of the transmitter.

12. The transmitter according to claim 8,
wherein the controller is further configured to compare the second output power to a threshold, and wherein the mode switch module is further configured to switch from the first mode of operation to the second mode of operation if the second output power is greater than or equal to the threshold.

13. The transmitter according to claim 8,
wherein the first mode of operation comprises a closed loop control mode of operation and the second mode of operation comprises an open loop control mode of operation, wherein the read back module is further configured to read back a transmitter output power characteristic by determining a closed loop control line value, and wherein the correlator module is further configured to correlate the closed loop control line value for the first output power of the closed loop control mode of operation to an open loop control line value for the second output power of the open loop control mode of operation.

14. The transmitter according to claim 13,
wherein the controller is further configured to compare the second output power to a threshold, and wherein the mode switch module is further configured to switch from the first mode of operation to the second mode of operation if the second output power is less than the threshold.

15. A method of operating a device including a transmitter, the transmitter capable of operating in a first mode of operation and a second mode of operation, the first mode of operation and the second mode of operation including a closed loop control mode and an open loop control mode, the first mode of operation comprising an open loop control mode of operation and the second mode of operation comprising a closed loop mode of operation, the method comprising:

operating the transmitter in the first mode of operation;

reading back a transmitter output power characteristic during the first mode of operation, to control the second mode of operation by reading back the measured transmitter output power;

correlating the read back transmitter output power characteristic during the first mode of operation to a transmitter output power characteristic of the second mode of operation;

measuring a transmitter output power;

receiving a power control command to change the output power of the transmitter from a first output power to a second output power; and correlating the transmitter output power of the open loop control mode of operation to a closed loop control line value for the second output power characteristic of the closed loop control mode of operation;

determining a desired output power of the second mode of operation based on the transmitter output power characteristic of the second mode of operation; and switching from the first mode of operation to the second mode of operation based on the transmitter output power characteristic of the second mode of operation meeting a predefined comparison criterion with a threshold.

16. The method according to claim 15, wherein the output power characteristic comprises at least one of a target output power and an actual output power.

* * * * *